(12) United States Patent
Hamilton et al.

(10) Patent No.: US 6,989,286 B2
(45) Date of Patent: *Jan. 24, 2006

(54) METHOD OF MANUFACTURING OPTICAL DEVICES AND RELATED IMPROVEMENTS

(75) Inventors: Craig James Hamilton, Ralston (GB); Olek Peter Kowalski, Paisley (GB); John Haig Marsh, Glasgow (GB); Stewart Duncan McDougall, Lanark (GB)

(73) Assignee: The University Court of the University of Glasgow, Glasgow (GB)

( * ) Notice: Subject to any disclaimer, the term of this patent is extended or adjusted under 35 U.S.C. 154(b) by 11 days.

This patent is subject to a terminal disclaimer.

(21) Appl. No.: 10/466,972
(22) PCT Filed: Jan. 23, 2002
(86) PCT No.: PCT/GB02/00292

§ 371 (c)(1),
(2), (4) Date: Dec. 12, 2003

(87) PCT Pub. No.: WO02/059952

PCT Pub. Date: Aug. 1, 2002

(65) Prior Publication Data

US 2004/0106224 A1 Jun. 3, 2004

(30) Foreign Application Priority Data

Jan. 23, 2001 (GB) .................................. 0101635

(51) Int. Cl.
H01L 21/20 (2006.01)
(52) U.S. Cl. ........................................................ 438/36
(58) Field of Classification Search ............. 438/22–47
See application file for complete search history.

(56) References Cited

U.S. PATENT DOCUMENTS

| 4,282,494 | A | 8/1981 | Yonezu et al. |
| 4,511,408 | A | 4/1985 | Holonyak, Jr. |
| 4,585,491 | A | 4/1986 | Burnham et al. |
| 4,594,603 | A | 6/1986 | Holonyak, Jr. |
| 4,639,275 | A | 1/1987 | Holonyak, Jr. |
| 4,727,556 | A | 2/1988 | Burnham et al. |
| 4,845,216 | A | 7/1989 | Taylor et al. |
| 4,845,727 | A | 7/1989 | Murray |

(Continued)

OTHER PUBLICATIONS

Mellvaney et al., "Far-field behaviour of 980 nm broad area lasers incorporating bandgap widened extended slab waveguides", Oct. 26, 1994, IEEE (1995).

(Continued)

Primary Examiner—Savitri Mulpuri
(74) Attorney, Agent, or Firm—Daspin & Aument, LLP; Jefferson Perkins (57) ABSTRACT

There is disclosed a method of manufacturing of optical devices, for example, semiconductor optoelectronic devices such as laser diodes, optical modulators, optical amplifiers, optical switches, and the like. There is further disclosed Optoelectronic Integrated Circuits (OEICs) and Photonic Integrated Circuits (PICs) including such devices. According to the present invention there is provided a method of manufacturing an optical device (40), a device body portion (15) from which the device (40) is to be made including a Quantum Well Intermixing (QWI) structure (30), the method including the step of plasma etching at least part of a surface of the device body portion (5) prior to depositing a dielectric layer (51) thereon so as to introduce structural defects at least into a portion (53) of the device body portion (5) adjacent the dielectric layer (51). The structural defects substanially comprise "point" defects.

21 Claims, 8 Drawing Sheets

U.S. PATENT DOCUMENTS

| | | | |
|---|---|---|---|
| 4,857,971 A | | 8/1989 | Burnham |
| 4,871,690 A | | 10/1989 | Holonyak, Jr. et al. |
| 5,384,797 A | | 1/1995 | Welch et al. |
| 6,027,989 A | * | 2/2000 | Poole et al. ................ 438/522 |
| 6,632,684 B2 | * | 10/2003 | Marsh et al. .................. 438/7 |
| 2002/0127752 A1 | * | 9/2002 | Thompson et al. ........... 438/22 |
| 2002/0131668 A1 | * | 9/2002 | Marsh et al. ................. 385/14 |

OTHER PUBLICATIONS

Qian et al., "Three Band-gap QW Intermixing in InP/InGaAs/InGaAsP System for Monolithically Integrated Optical Switch", IEEE 1998, pp. 194-195.

Marsh et al., "Quantum well intermixing in material systems for 1.5 um (invited)", J. Vac. Sci. Technol. A, vol. 16, No. 2, pp. 810-816, Mar./Apr. 1998.

Camacho et al., "Laser structure for generating high optical power in a singlemode waveguide", Electronics Letters, vol. 34, No. 5, pp. 460-461, Mar. 5, 1998.

Hamilton et al., "Bandgap turning of visible laser material", Electronics Letters, vol. 34, No. 7, pp. 665-666, Apr. 2, 1998.

Kowalski et al., Fabrication of narrow far-field InGaAs-InAlGaAs broad-area lasers using quantum well intermixed extended cavities, CLEO, Monday Morning, pp. 37-38, May 4, 1998.

Carpenter, "SIMS analysis of InGaAs/InAlGaAs wafers—Report No. Sl/GLU/6725", Institute of Surface Science and Technology, Loughborough University, 26 pgs., Apr. 27, 1998.

Marsh et al., "Monolithic integration in III-V semiconductors via a universal damage enhanced quantum well intermixing technique", SPIE Conference on Materials Modification by Ion Irradiation, Quebec, Canada, pp. 112-120, Jul., 1998.

A. Saher Helmy, "Micro Raman studies of disordering due to dielectric cap annealing in GaAs/AlGaAs heterostructures: A Progress Report", 23 pgs., May 5, 1998.

McDougall et al., "Monolithic Integration via a Universal Damage Enhanced Quantum-Well Intermixing Technique", IEEE Journal of Selected Topics in Quantum Electronics, vol. 4, No. 4, pp. 636-646, Jul./Aug. 1998.

Helmy et al., "Quantilative Model for the Kinetics of Compositional Intermixing in GaAs-AlGaAs Quantum-confined Heterostructures", IEEE Journal of Selected Topics in Quantum Electronics, vol. 4, No. 4, pp. 653-660, Jul./Aug. 1998.

Ke et al., "The electronic structure and optical properties of intermixed GaAs/AlGaAs double quantum wells", Journal of Applied Physics, vol. 84, No. 5, pp. 2855-2857, Sep. 1, 1998.

Li et al., "Silica capping for Al 0.3Ga 0.7As/GaAs and In0.2Ga0.8As/GaAs quantum well intermixing", Applied Physics Letters, vol. 73, No. 23, pp. 3393-3395, Dec. 7, 1998.

Helmy et al., "Control of silica cap properties by oxygen plasma treatment for single-cap selective impurity free vacancy disordering", Applied Physics Letters, vol. 74, No. 5, pp. 732-734, Feb. 1, 1999.

McDougall et al., "GaAs/AlGaAs waveguide pin photodiodes with non-absorbing input facets fabricated by quantum well intermixing", Electronics Letters, vol. 36, No. 8, pp. 749-750, Apr. 30, 2000.

Liu et al., "Fabrication of Monolithically Mach-Zender Asymmetric Interferometer Switch", IEEE 2000, pp. 412-414.

Intermixing Process control meeting: Effect of change of control TC from edge to centre, 1 pg., Apr. 6, 2000.

Qiu et al., "Monolithically Integrated Fabrication of 2x2 and 4x4 Crosspoint Switches Using Quantum Well Intermixing", pp. 415-418, IEEE 2000.

Ke et al., "Monolithically integrated distributed Bragg reflector lasers for 1.5 um operation with band gap shifted grating section", Optical Materials 14 (2000), pp. 193-196.

Liu et al., "Control of Multiple Bandgap shifts in InGaAs-AlInGaAs Multiple-quantum-Well Material using different thicknesses of PECVD SiO2 protection layers", IEEE Photonics Technology Letters, vol. 12, No. 9, pp. 1141-1143, Sep. 2000.

Qiu et al., "Precise control of the Blue-shift of the wavelength in InGaAs-InGaAsP Multiple quantum wells using a sputtered SiO2 technique", IEEE Lasers and Electro-Optics Society, 1999 12th Annual Meeting, vol. 1, pp. 309-310, 1999.

McDougall et al., "Monolithic Integration via a Universal Damage Enhanced Quantum-Well Intermixing Technique", IEEE Journal of Selected Topics in Quantum Electronics, vol. 4, No. 4, pp. 636-646, Jul./Aug. 1998.

Qiu et al., "Extended cavity lasers in InGaAs-InGaAsP and InGaIP-GaAs multi-quantum well structure using a sputtered SiO2 Technique", IEEE 10th International Conference on Indium Phosphide and related materials, May 11-15, 1998, pp. 635-638.

Kowalski et al., "A universal damage induced technique for quantum well intermixing", Applied Physics Letters, vol. 72, No. 5, Feb. 2, 1998, pp. 581-583.

Qiu et al., "Extended Cavity Lasers in InGaAs-InGaAsP and GaInP-AlGaInP Multi-Quantum Well Structure Using a Sputtered SiO2 Technique", Jpn. J. Appl. Phys., vol. 38, Feb. 1999, Pt. 1, No. 2B.

Hamilton et al., "High-Power and High-Brightness Visible Semiconductor Laser Diodes", Proceedings of SPIE, vol. 3947, Jan. 24, 2000, pp. 91-97.

Thornton et al., "Highly efficient, long-lived AlGaAs lasers fabricated by silicon impurity induced disordering", Appl. Phys. Lett., vol. 49, No. 3, Jul. 21, 1986, pp. 133-134.

Suzuki et al., "Fabrication of GaAlAs 'Window Stripe' Multi-Quantum-Well Heterostructure Lasers Utilising Zo Diffusion-Induced Alloying", Electronics Letters, vol. 20, No. 9, Apr. 26, 1984, pp. 383-384.

A13764 Al-quat MQW structure: Intermixing PL shifts recorded for control sample sputtered on week 1 and annealed each week, 4 pgs.

McDougall et al., "Harmonic modelocking at up to 440GHz repetition rates in InGaAs-InAlGaAs quantum well lasers", Departmetn of Electronics and Electrical Engineering, University of Glasgow.

Kowalski et al., "Monolithic integration in InGaAs-InAlGaAs optpelectonic devices for 1.55 um emission by quantum well intermixing", Departmetn of Electronics and Electrical Engineering, University of Glasgow.

PCT International Search Report for PCT/GB02/00292, prepared by the European Patent Office on Jul. 18, 2003, 4 pgs.

McDougall et al., "Harmonic modelocking at up to 440GHz repetition rates in InGaAs-InAlGaAs quantum well lasers", CLEO/Europe '98, Glasgow U.K., Sep. 13-18, 1998, Conference on Lasers and Electro Optics Europe, Technical Digest, 1998, pg. 209, 1998.

Kowalski et al., "Monolithic integration in InGaAs-InAlGaAs optoelectronic devices for 1.55um emission by quantum well intermixing", CLEO/Europe '98, Glasgow U.K., Sep. 13-18, 1998, Conference on Lasers and Electro Optics Europe, Technical Digest, 1998, pg. 209, 1998.

Marsh et al., "Applications of neutral impurity disordering in fabricating low-loss optical waveguides and integrated waveguide devices", Optical and Quantum Electronics, vol. 23, No. 7, pp. S941-S957, 1991.

* cited by examiner

Dielectric cap QWI

METHOD OF MANUFACTURING OPTICAL DEVICES AND RELATED IMPROVEMENTS

FIELD OF INVENTION

This invention relates to a method of manufacturing of optical devices, and in particular, though not exclusively, to manufacturing integrated optical devices or optoelectronic devices, for example, semiconductor optoelectronic devices such as laser diodes, optical modulators, optical amplifiers, optical switches, and the like. The invention further relates to Optoelectronic Integrated Circuits (OEICs) and Photonic Integrated Circuits (PICs) including such devices.

BACKGROUND OF INVENTION

Quantum Well Intermixing (QWI) is a process which has been reported as providing a possible route to monolithic optoelectronic integration. QWI may be performed in III–V semiconductor materials, eg Aluminium Gallium Arsenide (AlGaAs) and Indium Gallium Arsenide Phosphide (InGaAsP), which may be grown on binary substrates, eg Gallium Arsenide (GaAs) or Indium Phosphide (InP). QWI alters the band-gap of an as-grown structure through inter-diffusion of elements of a Quantum Well (QW) and associated barriers to produce an alloy of the constituent components. The alloy has a band-gap which is larger than that of the as-grown QW. Any optical radiation (light) generated within the QW where no QWI has taken place can therefore pass through a QWI or "intermixed" region of alloy which is effectively transparent to the said optical radiation.

Various QWI techniques have been reported in the literature. For example, QWI can be performed by high temperature diffusion of elements such as Zinc into a semiconductor material including a QW.

QWI can also be performed by implantation of elements such as silicon into a QW semiconductor material. In such a technique the implantation element introduces point defects in the structure of the semiconductor material which are moved through the semiconductor material inducing intermixing in the QW structure by a high temperature annealing step.

Such QWI techniques have been reported in "Applications of Neutral Impurity Disordering in Fabricating Low-Loss Optical Waveguides and Integrated Waveguide Devices", Marsh et al, Optical and Quantum Electronics 23, 1991, s941–s957, the content of which is incorporated herein by reference.

A problem exists with such techniques in that although the QWI will alter (increase) the band-gap of the semiconductor material post-growth, residual diffusion or implantation dopants can introduce large losses due to the free carrier absorption coefficient of these dopant elements.

A further reported QWI technique providing intermixing, is Impurity Free Vacancy Diffusion (IFVD). When performing IFVD the top cap layer of the III–V semiconductor structure is typically GaAs or Indium Gallium Arsenide (InGaAs). Upon the top layer is deposited a silica ($SiO_2$) film. Subsequent rapid thermal annealing of the semiconductor material causes bonds to break within the semiconductor alloy and Gallium ions or atoms—which are susceptible to silica ($SiO_2$)—to dissolve into the silica so as to leave vacancies in the cap layer. The vacancies then diffuse through the semiconductor structure inducing layer intermixing, eg in the QW structure.

IFVD has been reported in "Quantitative Model for the Kinetics of Compositional Intermixing in GaAs—AlGaAs Quantum—Confined Heterostructures", by Helmy et al, IEEE Journal of Selected Topics in Quantum Electronics, Vol 4, No 4, July/August 1998, pp 653–660, the content of which is incorporated herein by reference.

Reported QWI, and particularly IFVD methods, suffer from a number of disadvantages, eg the temperature at which Gallium out diffuses from the semiconductor material to the silica ($SiO_2$) film.

It is an object of at least one aspect of the present invention to obviate or at least mitigate at least one of the aforementioned disadvantages/problems in the prior art.

It is also an object of at least one aspect of the present invention to provide an improved method of manufacturing an optical device using an improved QWI process.

SUMMARY OF INVENTION

According to a first aspect of the present invention, there is provided a method of manufacturing an optical device, a device body portion from which the device is to be made including a Quantum Well (QW) structure, the method including the step of:
depositing a dielectric layer on at least part of a surface of the device body portion so as to introduce structural defects at least into a portion of the device body portion adjacent the dielectric layer.

According to a further aspect, the present invention provides a method of manufacturing an optical device, a device body portion from which the device is to be made including a Quantum Well (QW) structure, the method including the step of performing a plasma etch on at least part of a surface of the device body portion so as to introduce structural defects at least into a portion of the device body portion adjacent the surface layer, subsequent to which the etched surface is encapsulated with a dielectric layer.

The structural defects may include "point" defects.

Preferably, and advantageously, the plasma etch and dielectric layer deposition are performed by sputtering.

In a preferred embodiment the dielectric layer is deposited by sputtering using a diode sputterer.

The dielectric layer may beneficially substantially comprise silica ($SiO_2$), or may comprise another dielectric material such as aluminium oxide ($Al_2O_3$).

Preferably, the sputterer includes a chamber which may be substantially filled with an inert gas such as argon, preferably at a pressure of around 2 microns of Hg, or a mixture of argon and oxygen, eg in the proportion 90% / 10%.

The step of depositing the dielectric layer may comprise part of a Quantum Well Intermixing (QWI) process used in manufacture of the device.

The QWI process may comprise Impurity-Free Vacancy Disordering (IFVD).

Preferably, the method of manufacture also includes the subsequent step of annealing the device body portion including the dielectric layer at an elevated temperature.

It has been surprisingly found that by etching the semiconductor surface prior to depositing the dielectric layer used in QWI techniques such as IFVD by sputtering, damage induced point defects appear to be introduced into the portion of the device body portion adjacent the dielectric cap; the portion may, for example, comprise a top or "capping" layer. It is believed that the damage arises due to breakage of bonds in the capping layer before annealing, eg the application of thermal energy by rapid thermal annealing, thereby expediting transfer of Gallium and/or Indium from the capping layer into the dielectric layer.

Preferably the method of manufacture also includes the preceding steps of: providing a substrate; growing on the substrate a first optical cladding layer, a core guiding layer including a Quantum Well (QW) structure, and a second optical cladding layer.

The first optical cladding layer, core guiding layer, and second optical cladding layer may be grown by Molecular Beam Epitaxy (MBE) or Metal Organic Chemical Vapour Deposition (MOCVD).

In a first embodiment the method may also include the step of defining a pattern in photoresist on a surface of the device body portion, performing the etch and subsequent dielectric layer deposition and lifting off the photoresist so as to provide the dielectric layer on the said at least part of the surface of the device body portion.

In said first embodiment, the method may also include the step of depositing a further dielectric layer on the surface of the device body and on a surface of the dielectric layer prior to annealing, preferably without a plasma etch stage, by a technique other than sputtering, eg Plasma Enhanced Chemical Vapour Deposition (PECVD).

In a second embodiment the method may include the steps of depositing the further dielectric layer and then performing the substrate etch and depositing the dielectric layer.

In said first and second embodiments, the dielectric layer which encapsulates the previously etched layer may comprise an intermixing cap; the further dielectric layer may comprise an intermixing suppressing cap.

The plasma etch may typically be performed for a duration between 0.5 and 10 minutes and the thickness of the encapsulating dielectric layer may be between 10 nanometers to a few hundred nanometers.

The annealing step may occur at a temperature of around 650° C. to 850° C. for around 0.5 to 5 minutes, and in one embodiment at substantially 800° C. for around 1 minute.

According to a second aspect of the present invention there is provided a method of manufacturing an optical device, a device body portion from which the device is to be made including a Quantum Well (QW) structure, the method including the step of depositing a dielectric layer on at least part of a surface of the device body portion by sputtering.

According to a third aspect of the present invention there is provided an optical device fabricated from a method according to either of the first or second aspects of the present invention.

The optical device may be an integrated optical device or an optoelectronic device.

The device body portion may be fabricated in a III–V semiconductor materials system.

In one embodiment the III–V semiconductor materials system may be a Gallium Arsenide (GaAs) based system, and may therefore operate at one or more wavelengths in the range 600 to 1300 nm. Alternatively, in a preferred embodiment the III–V semiconductor materials system may be an Indium Phosphide based system, and may therefore operate at one or more wavelength in the range 1200 to 1700 nm. The device body portion may be made at least partly from Aluminium Gallium Arsenide (AlGaAs), Indium Gallium Arsenide (InGaAs), Indium Gallium Arsenide Phosphide, (InGaAsP), Indium Gallium Aluminium Arsenide (InGaAlAs) and/or Indium Gallium Aluminium Phosphide (InGaAlP).

The device body portion may comprise a substrate upon which are provided a first optical cladding layer, a core guiding layer, and a second optical cladding layer.

Preferably the Quantum Well (QW) structure is provided within the core guiding layer.

The core guiding layer, as grown, may have a smaller band-gap and higher refractive index than the first and second optical cladding layers.

According to a fourth aspect of the present invention, there is provided an optical integrated circuit, optoelectronic integrated circuit (OEIC), or photonic integrated circuit (PIC) including at least one optical device according to the third aspect of the present invention.

According to a fifth aspect of the present invention, there is provided a device body portion ("sample") when used in a method according to either the first or the second aspects of the present invention.

According to a sixth aspect of the present invention, there is provided a wafer of material including at least one device body portion when used in a method according to either of the first or second aspects of the present invention.

According to a seventh aspect of the present invention, there is provided a sputtering apparatus when used in a method according to the second aspect of the present invention.

Preferably the sputtering apparatus is a diode sputterer.

According to an eighth aspect of the present invention, there is provided use of a sputtering apparatus in a method according to either of the first or second aspects of the present invention.

BRIEF DESCRIPTION OF THE DRAWINGS

An embodiment of the present invention will now be described, by way of example only, and with reference to the accompanying drawings.

DETAILED DESCRIPTION OF DRAWINGS

Figure 1:
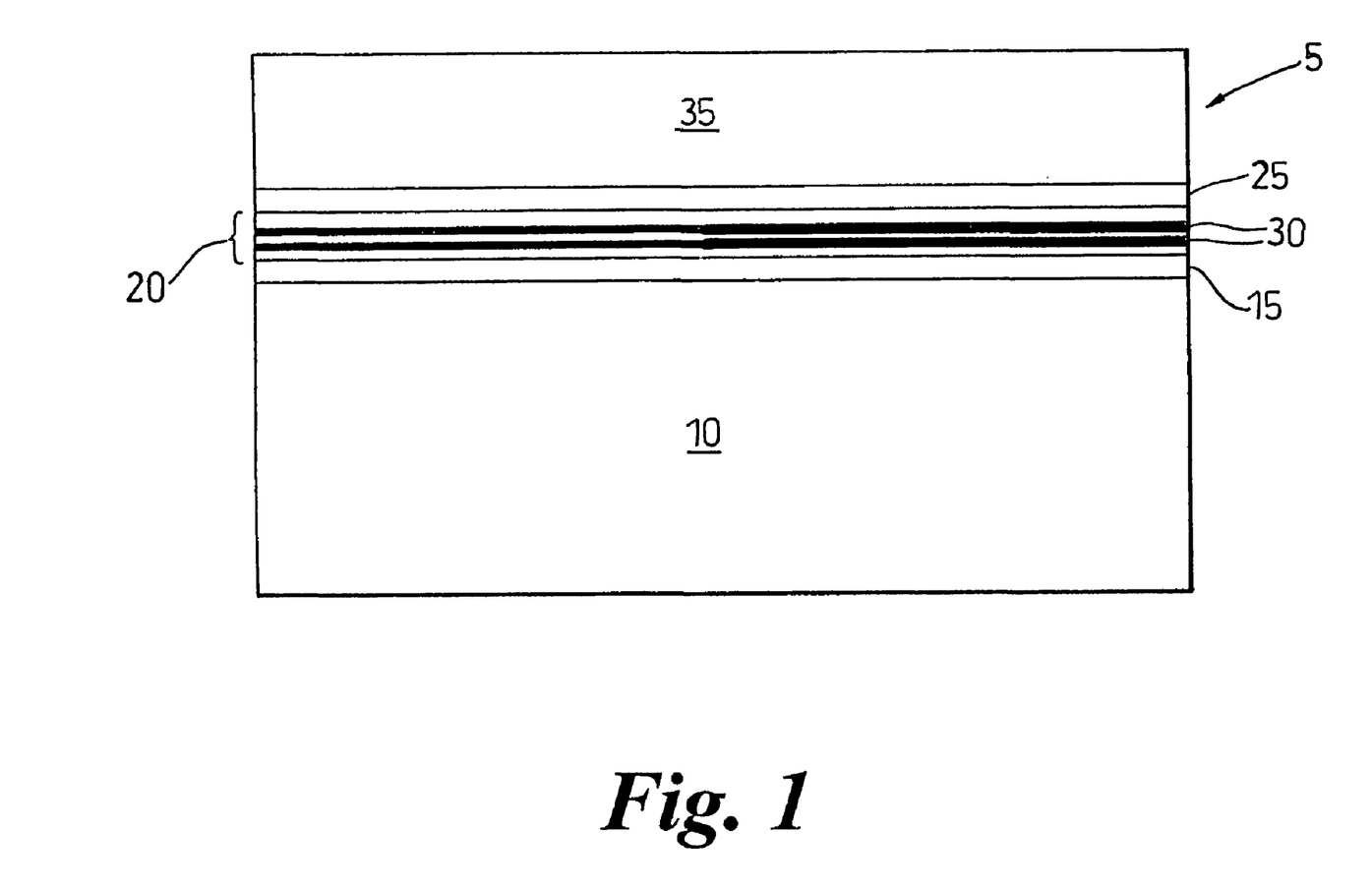
FIG. 1 is a side view of a device body portion, as grown, for use in a method of manufacture of an optical device according to an embodiment of the present invention.

Referring initially to FIG. 1, there is shown a device body portion, generally designated 5, as grown, for use in a method of manufacture of an optical device according to a first embodiment of the present invention. The optical device is an integrated optical device or an optoelectronic device.

The device body portion 5 is suitably fabricated in a III–V semiconductor material system such as Gallium Arsenide (GaAs), and therefore operates at one or more wavelength in the range 600 to 1300 nm. Alternatively, and beneficially, the device body portion is fabricated in an Indium Phosphide (InP) semiconductor system and therefore operates at one or more wavelength in the range 1200 to 1700 nm. The device body portion 5 may be made at least partly from Aluminium Gallium Arsenide (AlGaAs), Indium Gallium Arsenide (InGaAs), Indium Gallium Arsenide Phosphide (InGaAsP), Indium Aluminium Gallium Arsenide (InAlGaAs) and/or Indium Gallium Aluminium Phosphide (InGaAlP). In this described first embodiment, the device body portion is made from AlGaAs.

The device body portion 5 may form part of a semiconductor wafer (see FIG. 1) together with a plurality of other possibly like optical devices which may be cleaved from the wafer after processing. The device body portion 5 comprises substrate 10 upon which is provided a first optical cladding layer 15, a core guiding layer 20, and a second optical cladding layer 25. A Quantum Well (QW) structure 30, including at least one Quantum Well, is provided within the core guiding layer 20, as grown. On the second optical cladding layer 30 there is provided a capping layer 35.

As will be appreciated, the core guiding layer 20, as grown, has a smaller band-gap and higher refractive index than the first and second optical cladding layer 15, 25.

Figure 2:
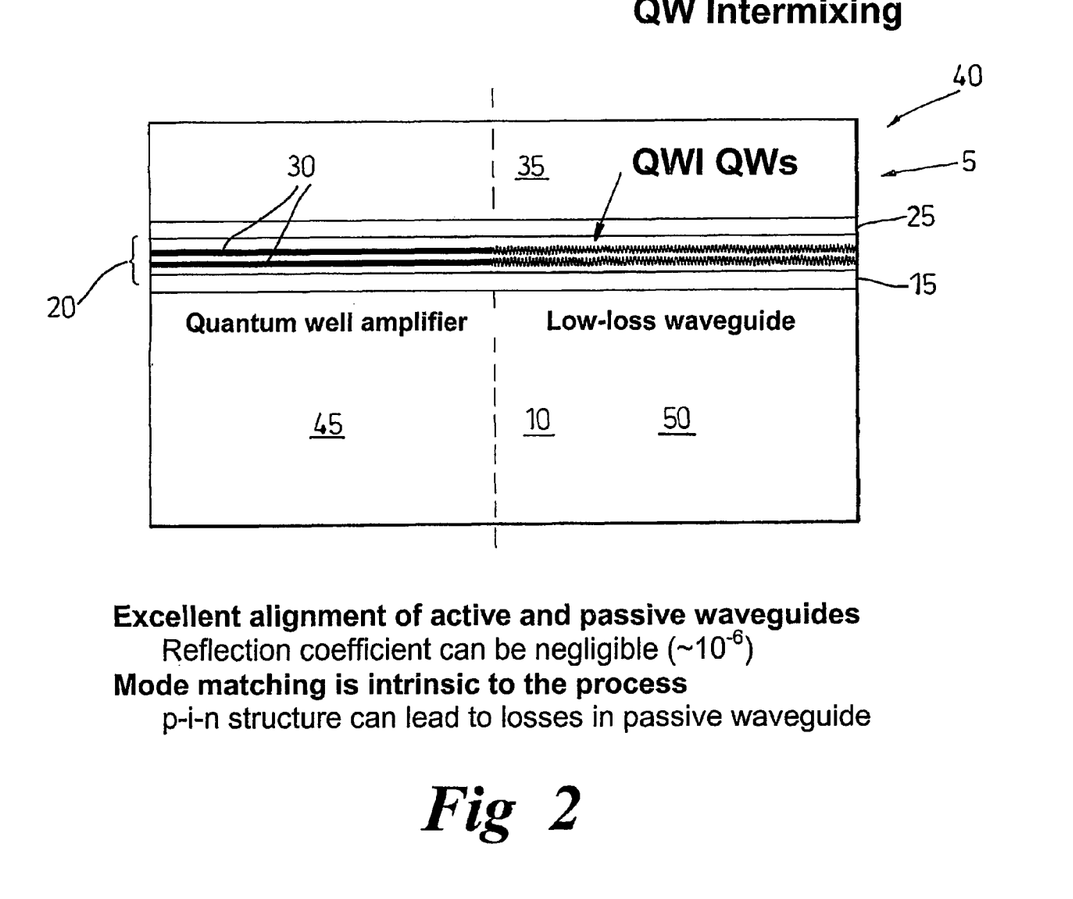
FIG. 2 is a side view of an optical device according to an embodiment of the present invention manufactured from the device body portion of FIG. 1.

Referring now to FIG. 2, there is shown an optical device, generally designated 40, manufactured from the device body portion 5 of FIG. 1, by a method which will be described in detail hereinafter. As can be seen from FIG. 2, the device 40 comprises an active region 45 and a passive region 50. In this embodiment the active region 45 comprises a Quantum Well (QW) amplifier. However, it should be understood that the active region 45 may, in other embodiments, comprise a laser, modulator switch, detector or like active (electrically controlled) optical device. Further, the passive region 50 comprises a low-loss waveguide wherein the Quantum Well structure 30 has been at least partially removed by a Quantum Well Intermixing (QWI) technique, as will hereinafter be described in greater detail.

The device 40 has excellent alignment between the core layer 20 waveguiding regions of the active region 45 and passive region 50, and has a reflection coefficient between the active region 45 and passive region 50 which is substantially negligible (of the order of $10^{-6}$). Further, mode matching between the active region 45 and the passive region 50 is intrinsic to the device 40.

Typically, the substrate 10 is n-type doped to a first concentration, while the first cladding layer 15 is n-type doped to a second concentration. Further, the core layer 20 is typically substantially intrinsic, while the second cladding layer 25 is typically p-type doped to a third concentration. Further, the cap layer (or contact layer) 35 is p-type doped to a fourth concentration. It will be appreciated by those skilled in the art, that the cap layer 35 and second cladding layer 25 may be etched into a ridge (not shown), the ridge acting as an optical waveguide to confine optical modes within the core layer 20, both within the optically active region 45 and the optically passive region 50. Further, contact metallisations (not shown) may be formed on at least a portion of the top surface of the ridge within the optically active region 45, and also on an opposing surface of the substrate 10, as is known in the art.

It will further be appreciated that the device 40 may comprise part of an optical integrated circuit, optoelectronic integrated circuit (OEIC), or photonic integrated circuit (PIC) which may comprise one or more of such optical devices 40.

Figure 3:
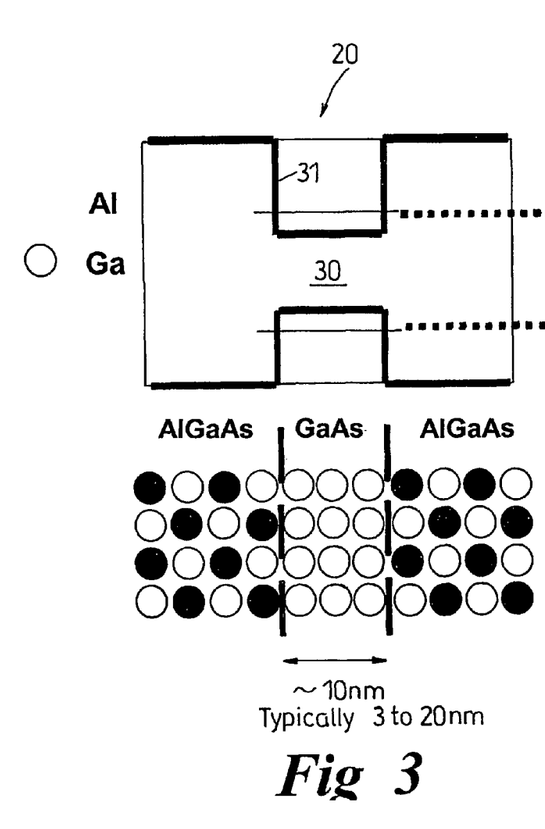
FIG. 3 is a schematic view of band-gap energies of a part of the device body portion of FIG. 1 the part comprising a core layer including a Quantum Well therein.

Referring now to FIG. 3, there is shown a schematic representation of the band-gap energies of a Quantum Well 31 of the Quantum Well structure 30 within the core layer 20 of the device body portion 5, as grown. As can be seen from FIG. 3, the AlGaAs core layer 20 includes at least one Quantum Well 31, with the Quantum Well structure 30 having a lower aluminium content than the surrounding core layer 20, such that the band-gap energy of the Quantum Well structure 30 is less than that of the surrounding AlGaAs core layer 20. The Quantum Well structure 30 is typically around 3 to 20 nm thick, and more typically around 10 nm in thickness.

It will be understood that the description of FIG. 3 also applies with suitable amendment to a system with an InGaAsP core layer, or any of the other III–V systems discussed above.

Figure 4:
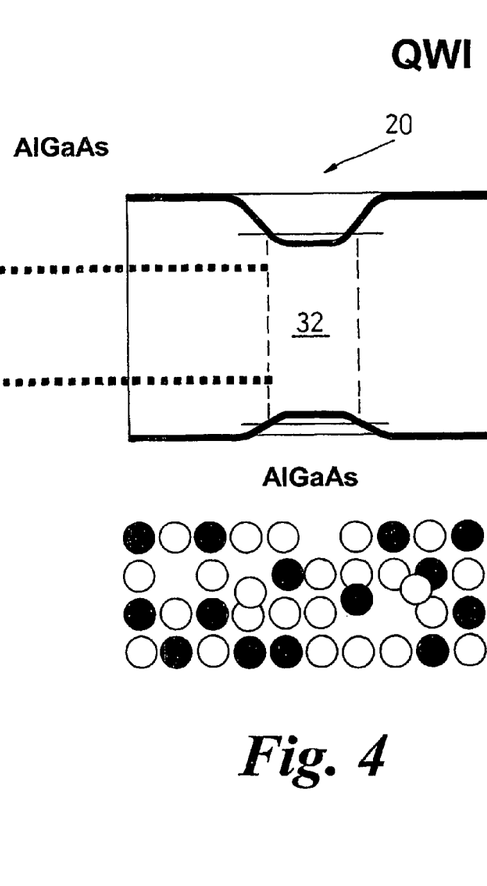
FIG. 4 is a schematic view similar to FIG. 3 of band-gap energies of a corresponding part of the optical device of FIG. 2 when Quantum Well Intermixed.

Referring now to FIG. 4, there is shown a corresponding portion 32 of the core layer 20 as in FIG. 3, but which has been Quantum Well Intermixed (QWI) so as to effectively increase the band-gap energy (meV) of the part 32 which corresponds to the Quantum Well 31 of the Quantum Well structure 30. Quantum Well Intermixing (QWI) therefore essentially "washes out" the Quantum Well structure 30 from the core layer 20. The portion shown in FIG. 4 relates to the passive region 50 of the device 40. As will be understood, optical radiation transmitted from or generated within the optically active region 45 of device 40 will be transmitted through the low loss waveguide provided by the Quantum Well Intermixed (QWI) region 32 of the core layer 20 of the passive region 50.

Figure 5A:
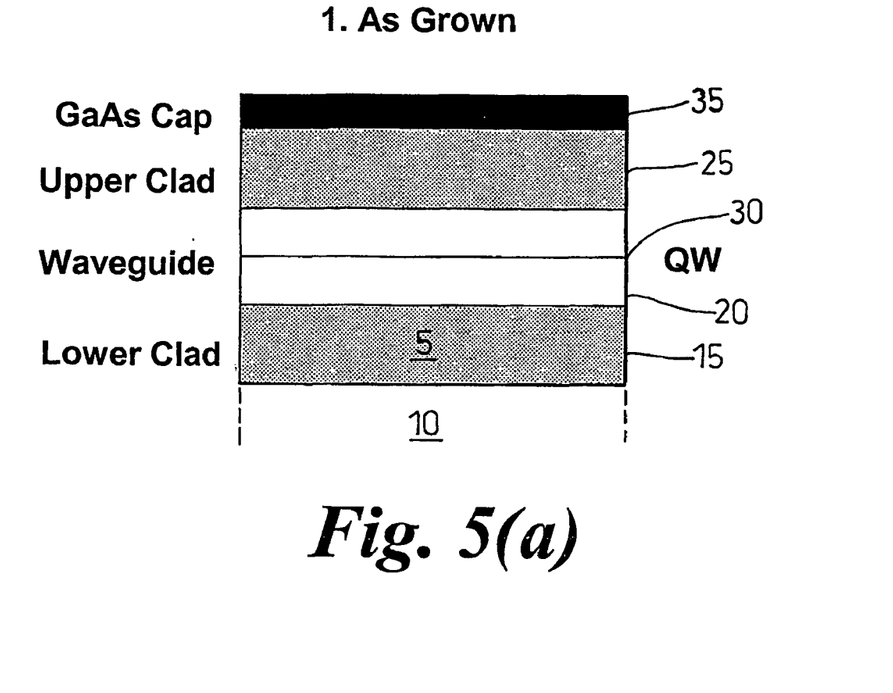
FIGS. 5(a) to 5(f) are a series of schematic side views of a device body portion during various steps of a method of manufacture of the optical device of FIG. 2.
Figure 5B:
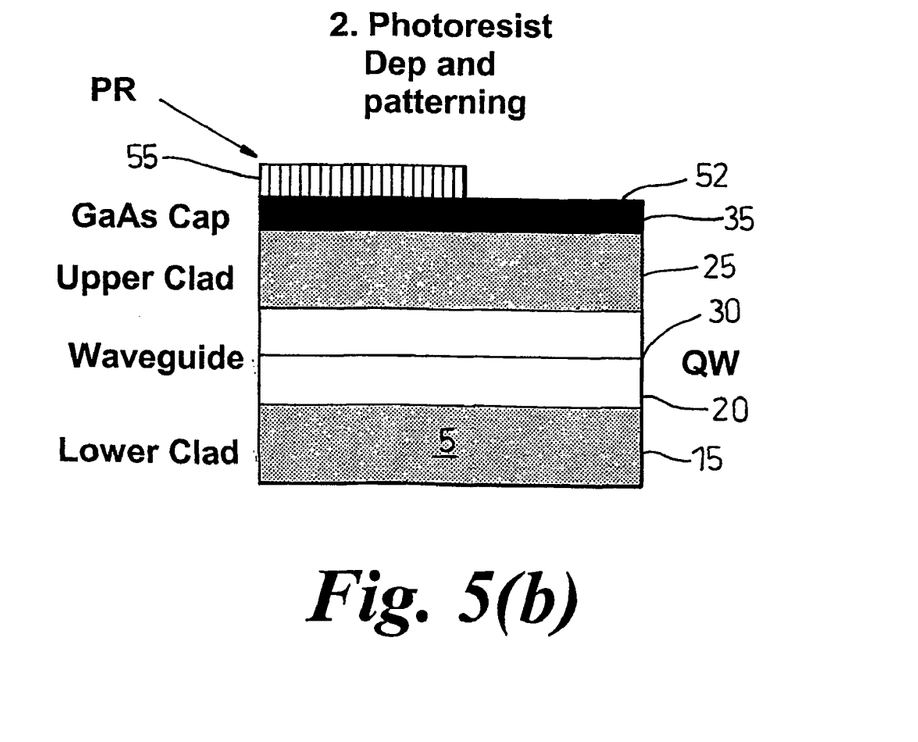
Figure 5C:
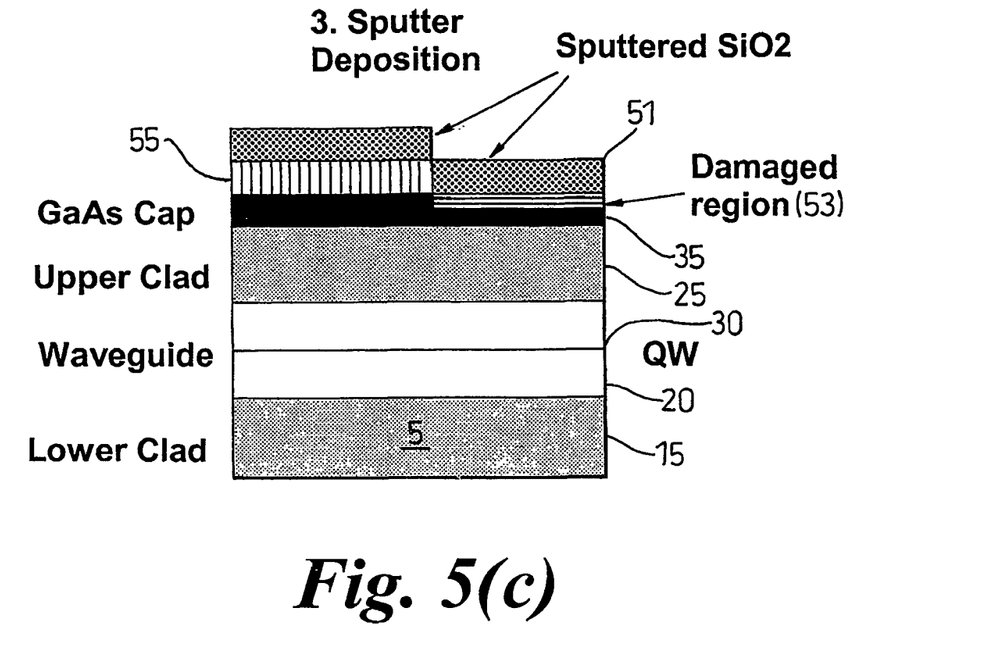
Figure 5D:
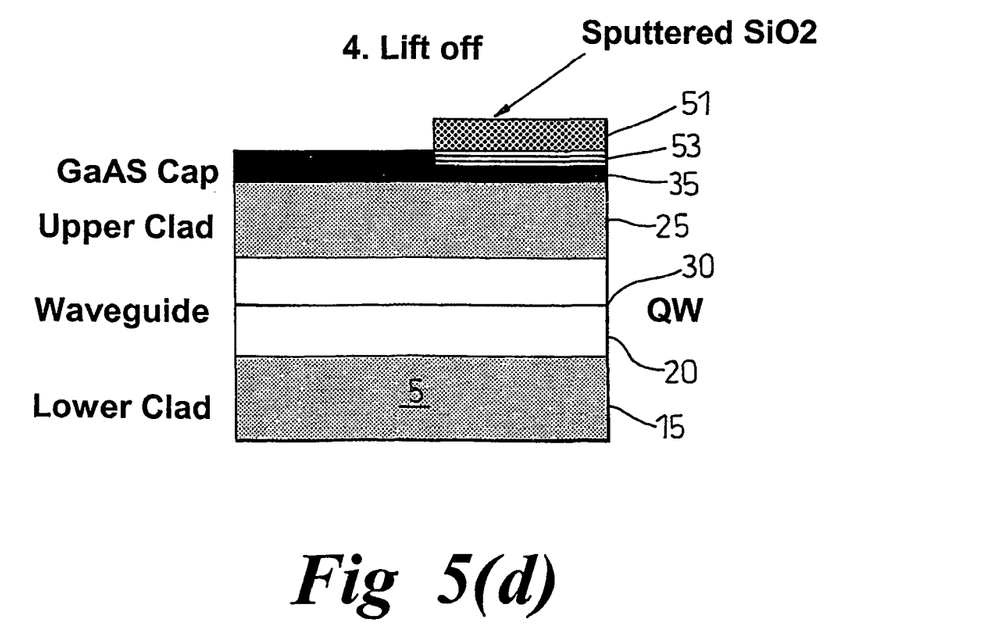

Referring now to FIGS. 5(a) to (f), there is illustrated a first embodiment of a method of manufacturing an optical device 40 from a device body portion 5, including a Quantum Well (QW) structure 30 according to the present invention, the method including the steps (see FIGS. 5(b) to (d)) of performing a plasma etch and subsequent deposition of a dielectric layer 51 on at least part of a surface 52 of the device body portion 5 so as to introduce point defects into a portion 53 of the device body portion 5 adjacent the dielectric layer 51.

The method of manufacture begins with the step of providing a substrate 10, growing on the substrate 10 first optical cladding layer 15, core guiding layer 20 including at least one Quantum Well (QW) 30, second optical cladding layer 25, and cap layer 35.

The first optical cladding layer 15, core guiding layer 20, second optical cladding layer 25, and cap layer 35 may be grown by known semiconductor epitaxial growth techniques such as Molecular Beam Epitaxy (MBE) or Metal Organic Chemical Vapour Deposition (MOCVD). Once the device body 5 has been grown—normally as part of a wafer (not shown) including a plurality of such device body portions 5—a pattern may be defined in photoresist (PR) 55 on surface 52 of the device body portion 5.

The plasma etch is performed on surface prior to the deposition of the dielectric layer 51 on the surface 52, and the photoresist 55 lifted off so as to leave the dielectric layer 51 on the said at least part of the surface 52 of the device body portion 5. As can be seen from FIGS. 5(c) and 5(d), the plasma etch performed on, and/or dielectric layer 51 deposited on, at least part of the surface 52 of device body portion 5, causes localised damage in region 53 of the cap layer 35, and introduces point defects into the cap layer 35.

Figure 6:
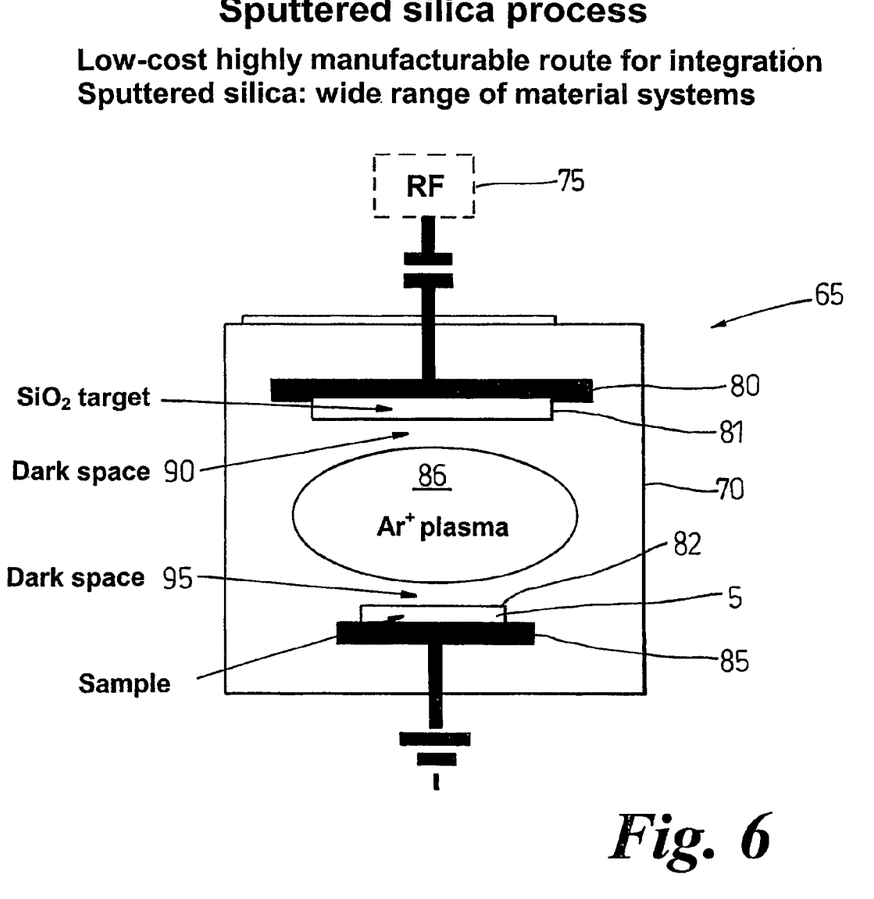
FIG. 6a is schematic representation of a diode sputterer apparatus for use in deposition of a dielectric layer on the device body portion of FIGS. 5 (a) to (f) during a dielectric layer deposition step shown in FIG. 5(c)

Referring briefly to FIG. 6, the plasma etch and dielectric layer 51 deposition are effected by sputtering, and in this embodiment the etch and dielectric layer 51 deposition are performed by sputtering using a diode sputterer apparatus, generally designated 65. The dielectric layer 51 substantially comprises silica ($SiO_2$), but may in a modification comprise another dielectric material such as aluminium oxide ($Al_2O_3$).

As can be seen from FIG. 6, the sputterer apparatus 65 includes a chamber 70 which in use is substantially filled with an inert gas such as argon which is preferably provided within the chamber 70 at a pressure of around 2 microns of Hg. The sputterer 65 also comprises an RF source 75 which can be connected to either (a) the target electrode (cathode) 80 of the diode sputterer 65 for dielectric layer deposition, or (b) the substrate electrode 85 for plasma etch of the device body portion.

A silica target 81 is provided on the target electrode (cathode) 80, while the device body portion 5 (on wafer 82) is provided on the substrate electrode (anode) 85 of the sputterer 65. In use, as can be seen from FIG. 6, an argon plasma 86 is generated between the cathode 80 and anode 85 with first and second dark spaces 90,95 being provided between the silica target 81 and the argon plasma 86 and between the argon plasma and the device body portion 5, respectively.

The steps of plasma etching the semiconductor surface and depositing the dielectric layer 51 comprises part of a Quantum Well Intermixing (QWI) process used in the manufacture of the device 40, the QWI process comprising (in a preferred embodiment) an Impurity-Free Vacancy Disordering (IFVD) technique. It has been surprisingly found that by plasma etching the semiconductor surface and subsequently depositing the dielectric layer 51 used in QWI techniques such as IFVD by sputtering using the sputterer 65, damage induced defects appear to be introduced into the portion 53 of the device body portion 5 adjacent dielectric cap 51; the portion 53 in this case comprising part of the cap layer 35. It is believed that the damage breaks bonds in the cap layer 35 prior to annealing (which will hereinafter be described), eg the application of thermal energy by rapid thermal annealing, thereby expediting the transfer of gallium and/or indium from the cap layer 35 into the dielectric layer 51.

Figure 5E:
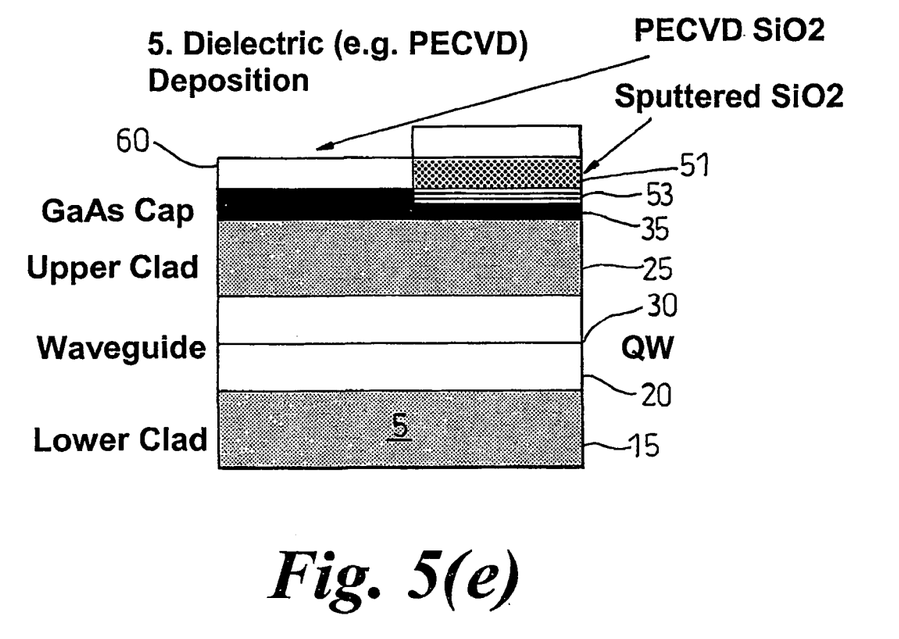

The dielectric layer 51 is typically between 10 to 1000 nm, and typically 200 or 300 nm in thickness. The method of manufacture includes a further step as shown in FIG. 5(e) of depositing further dielectric layer 60 on the surface 52 of device body 5 and on a surface of the dielectric layer 51 prior to annealing. The further dielectric layer 60 is deposited without a preliminary plasma etch and preferably also by a technique other than diode sputtering, and preferably by a technique other than sputtering per se, eg Plasma Enhanced Chemical Vapour Deposition (PECVD).

The dielectric layer 51 encapsulating the plasma etched layer therefore comprises an intermix cap layer, while the further dielectric layer 60 comprises an intermix suppressing cap layer. The intermix suppressing cap layer is used to protect the surface 52 from arsenic and/or phosphorus desorption. The method will work without the intermix suppressing cap layer; however the quality of the surface 52 may not be so good.

Figure 5F:
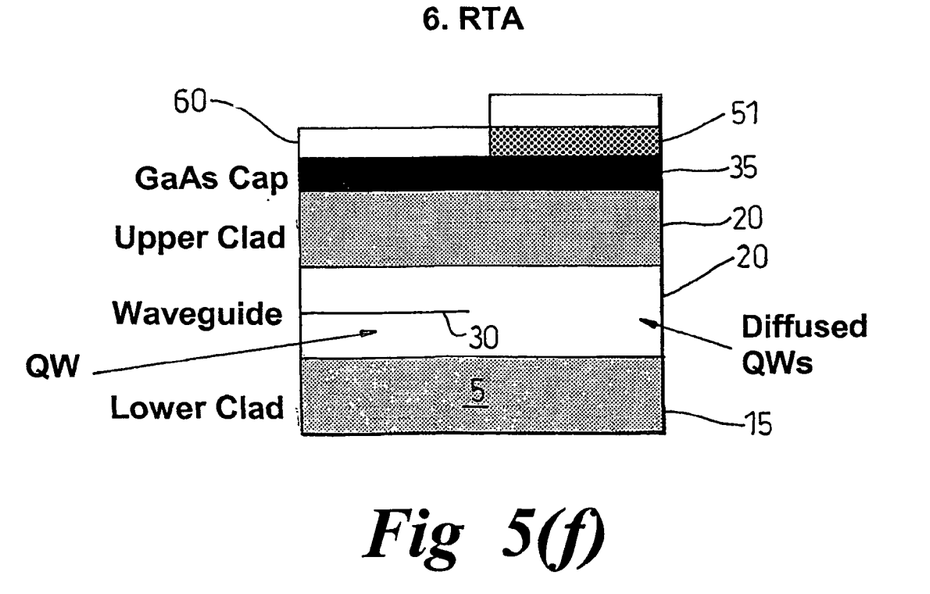

As shown in FIG. 5(f), subsequent to deposition of the further dielectric layer 60, the device body portions including the dielectric layer 51 and further dielectric layer 60 are annealed at an elevated temperature. The annealing stage comprises a rapid thermal annealing stage, the annealing temperature being around 700° C. to 1000° C., or more preferably 650° C. to 850° C., for around 0.5 to 5 minutes, and in one implementation, at approximately 800° C. for about 1 minute.

Figure 7A:
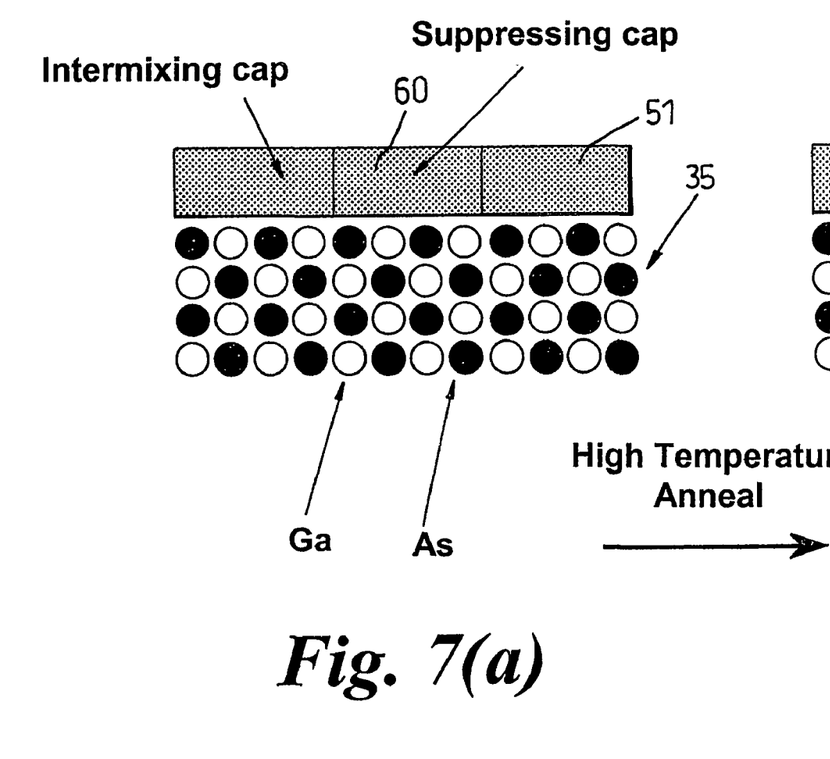
FIGS. 7(a) and (b) are more detailed schematic side views of the device body portion of FIGS. 5 (a) to (f) before and after an annealing step shown in FIG. 5(f).
Figure 7B:
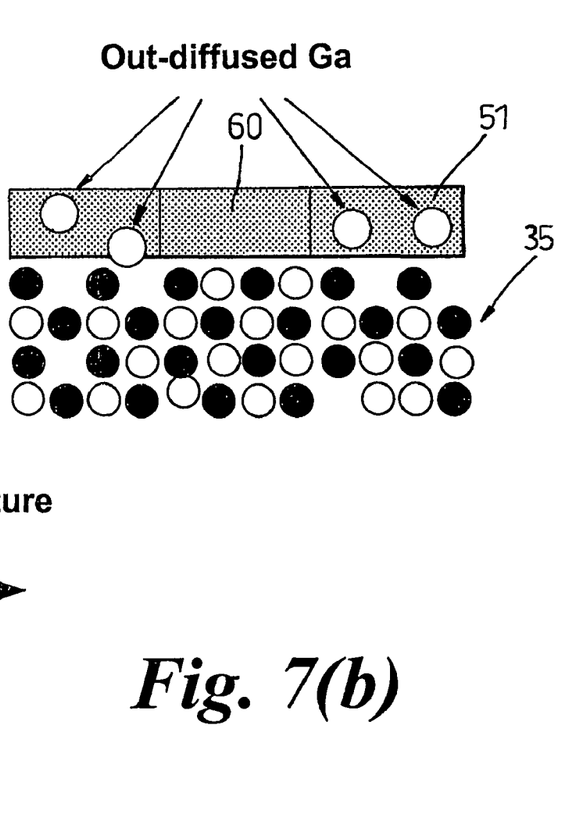

The action of the annealing step of FIG. 5(f) is illustrated diagrammatically in FIGS. 7(a) and (b). As can be seen from FIGS. 7(a) and (b), the annealing step causes "out diffusion" of gallium and/or indium from the cap layer 35 to the intermixing cap, ie dielectric layer 51. However, portions of the cap layer 35 below the suppressing cap, ie further dielectric layer 60, are not subject to gallium and/or indium "out-diffusion". The portions of the cap layer 35 which lie within an area of the intermixing cap, ie dielectric cap 51, are subject to out-diffusion of gallium and/or indium as shown in FIG. 7(b). The out-diffusion of gallium and/or indium leaves vacancies behind which vacancies migrate from the cap layer 35, through the second cladding layer 25, and into the core layer 20, and hence to the Quantum Well structure(s) 30, thereby changing the effective band-gap of the Quantum Well (QW) structure 30, and effectively washing-out the Quantum Wells of the Quantum Well structure 30 below the intermixing cap layer.

It will be appreciated that the intermixing cap, ie the dielectric layer 51 encapsulating the plasma etched surface 52, is provided within the area of the passive region 50 to be formed in device 40, while the suppressing cap, ie further dielectric layer 60, is provided on the device body portion 5 in areas such as the optically active region 45 to be formed on the device 5, which areas are not to be Quantum Well Intermixed (QWI).

Once the device body portion 5 has been processed to the stage of FIG. 5(f), and annealed, the dielectric layer 51 and further dielectric layer 60 may be removed by conventional methods, eg wet or dry etching.

EXAMPLE

There now follows examples which illustrate typical band-gap shifts which can be obtained using IFVD in a method of manufacturing an optoelectronic device according to the present invention in a long wavelength aluminium alloy such as Indium Aluminium Gallium Arsenide, (InAlGaAs), or InGaAsP, (InGaAsP), grown on an Indium Phosphide (InP) substrate.

The dielectric layer 51 deposition requires a sputter chamber 70 configured with a target-substrate electrode (plate) separation of the order of 50 to 100 mm. The target electrode 80 and substrate electrode 85 are each configured as substantially eight inch circular plates. The gas used in this example for sputter etch and deposition is typically argon, but other suitable inert gases may be used, and also small amounts of oxygen may be added to the argon plasma 86, eg approximately 10% by volume, to improve the stoichiometry of the deposited dielectric layer 51. The dielectric material used in the method is typically silica ($SiO_2$), but other dielectric materials such as aluminium oxide ($Al_2O_3$) can be used.

It has been found that a preferred pressure range in the chamber 70 for the method is between 1 and 5 microns of Hg. For sputter etch RF power values shown in Table 1 below, a one minute sputter etch was carried out on the surface 52 of the semiconductor wafer 52, including at least one device body portion 5. The thickness of the subsequently deposited dielectric film 45 was from 10 to a few hundred nm. The band-gap shift figures in Table 1 illustrate the band-gap shift in an InGaAs—InAlGaAs QW structure 30 for an anneal at a temperature of 800° C. for a time of 1 minute.

TABLE 1

| Sputter etch RF power | Deposition Conditions | Band gap shift (nm) |
| --- | --- | --- |
| None | PECVD ($SiO_2$) | 1 |
| 300 W | Sputtered ($SiO_2$) | 12 |
| 500 W | Sputtered ($SiO_2$) | 21 |
| 700 W | Sputtered ($SiO_2$) | 38 |

Table 1 illustrates that etching the surface of the semiconductor 52 followed by encapsulation with sputtered silica provides an enhancement in intermixing compared to non-sputtered silica ($SiO_2$), and also illustrates that the effectiveness of the pre-etched sputtered silica (SiO$_2$) cap increases with RF power used during the sputter etch.

Further data from plasma etching the surface 53 of an InGaAs—InGaAsP QW structure followed by deposition of sputtered SiO$_2$ layer 51 is presented in Table 2. Two sputter etch powers are shown in Table 2, along with two sputtering pressure settings, each referring to a one minute sputter etch of the semiconductor surface 52, including at least one device body portion 5. The thickness of the subsequently deposited dielectric film 51 was from 10 to a few hundred nm. The band-gap shift figures in Table 2 illustrate the band-gap shift in an InGaAs—InGaAsP QW structure 30 for an anneal at a temperature of 700° C. for a time of 1 minute.

TABLE 2

| Sputter etch RF Power | Sputter etch pressure | Deposition Conditions | Band gap shift (nm) |
|---|---|---|---|
| NONE | NONE | PECVD (SiO$_2$) | 11 |
| 300 | 1 | Sputtered (SiO$_2$) | 61 |
| 300 | 3 | Sputtered (SiO$_2$) | 58 |
| 750 | 1 | Sputtered (SiO$_2$) | 78 |
| 750 | 3 | Sputtered (SiO$_2$) | 45 |

Table 2 again illustrates that etching the surface 52 of the semiconductor followed by encapsulation with sputtered silica 51 provides an enhancement in intermixing compared to non-sputtered silica (SiO$_2$), and also illustrates that the effectiveness of the pre-etched sputtered silica (SiO$_2$) cap 51 is not strongly dependent on pressure for low power etches but is dependent upon pressure for higher power etches, the effectiveness decreasing with increasing sputter pressure. Table 2 also illustrates the lower thermal stability of the InGaAs—InGaAsP QW material compared to InGaAs—InAlGaAs QW material, as, for a given sputter etch power, larger shifts are obtained at reduced annealing temperatures.

In a second embodiment of a method of manufacturing an optical device 40 according to the present invention, to process a wafer to produce more than one band-gap a film of PECVD SiO$_2$ is deposited on to the wafer to provide further dielectric layer 60. Photolithography techniques are then used to delineate a pattern on top of the PECVD SiO$_2$. Either wet or dry etching can then be used to transfer the pattern into the PECVD (SiO$_2$).

Patterned photoresist (PR) is then left on top of the patterned PECVD (SiO$_2$), and the sample/wafer is then placed into the sputtering apparatus 65 for plasma etching of the uncoated surface 52 and subsequent deposition of the dielectric layer 51. After deposition the sample is immersed in acetone and the sputtered SiO2 on the photoresist is removed in a "lift-off" process.

A rapid thermal anneal is now performed at a suitable temperature (650–850° C.) for the required period of time (0.5–5 min). This enables the point defects generated at the surface 52 to propagate through the device body portion 5 and cause interdiffusion of the elements.

It will be appreciated that the embodiment of the invention hereinbefore described are given by way of example only, and are not meant to limit the scope thereof in any way.

It should be particularly understood that the damage induced in the semiconductor device body portion 5 adjacent to the sputtered dielectric layer 51 is believed to arise from bombardment of ions and/or radiation in the form of secondary electrons and soft x-rays. The damage to the surface 50 of the semiconductor device body portion 5 or wafer 82, can be introduced by various means in the sputtering apparatus 65, an effective method being to use a diode configuration in the deposition chamber 70.

Using a diode configuration is also believed to permit more radiation damage to the device body portion 5 (or "sample") than in the more usual magnetron machine arrangement wherein magnets create a high local field which it is believed stop particles travelling from the dielectric target 81 to the device body portion 5 provided on the wafer 82 of semiconductor material.)

It will further be appreciated that an optical device according to the present invention may include a waveguide such as a ridge or buried heterostructure or indeed any other suitable waveguide.

It will also be appreciated that the Quantum Well Intermixed (QWI) regions may comprise optically active device(s).

Further, it will be appreciated that sequential processing including using several RF powers may be used to provide a device with several different QWI band-gaps.

What is claimed is:

1. A method of manufacturing an optical device, a device body portion from which the device is to be made including a Quantum Well Intermixing (QWI) structure, the method including the steps of:
    providing the device body portion;
    forming the Quantum Well Intermixing structure in the device body portion, and said step of forming including performing a plasma etch on at least part of a surface of the device body portion so as to introduce structural defects at least into a portion of the device body portion adjacent the surface, the plasma etch occurring over an etch time of at least 0.5 minutes at a power of at least 300 W; and
    subsequently capping the etched surface with a dielectric layer.

2. The method of claim 1, wherein the structural defects substantially comprise point defects.

3. The method of claim 1, wherein the plasma etch is performed by sputtering.

4. The method of claim 1, wherein the dielectric layer is deposited by sputtering.

5. The method of claim 1 further including the step of annealing the device after said plasma etching and capping steps.

6. The method of claim 5 in which the annealing step comprises rapid thermal annealing.

7. The method of claim 6 in which the annealing step uses a temperature of between 650° C. and 850° C. for a period of between 0.5 and 5 minutes.

8. The method of claim 1, wherein the dielectric layer is selected from silica (SiO$_2$) and aluminum oxide (Al$_2$O$_3$).

9. The method of claim 3 in which the sputtering step is carried out in a chamber which is substantially filled with an inert gas.

10. The method of claim 9 wherein the inert gas is selected from argon and a mixture of argon and oxygen.

11. The method of claim 1 in which the steps of plasma etching and capping the etched surface with a dielectric layer comprises part of a Quantum Well Intermixing (QWI) process used in manufacture of the device.

12. The method of claim 11 wherein the QWI process comprises Impurity-Free Vacancy Disordering (IFVD).

13. The method of claim 1, wherein the method of manufacture also includes the preceding steps of:
    providing a substrate; and
    growing on the substrate:
    a first optical cladding layer,
    a core guiding layer including a Quantum Well Intermixing (QWI) structure; and
    a second optical cladding layer.

14. The method of claim 13 wherein the first optical cladding layer, core guiding layer, and second optical cladding layer are grown by a growth technique selected from: Molecular Beam Epitaxy (MBE) and Metal Organic Chemical Vapour Deposition (MOCVD).

15. The method of claim 1 further including the step of defining a pattern in photoresist on a surface of the device body portion, etching the uncoated device body portion prior to depositing the dielectric layer and lifting off the photoresist so as to provide the dielectric layer on the said at least part of the surface of the device body portion.

16. The method of claim 14 further including the step of depositing a further dielectric layer on the surface of the device body and on a surface of the pre-etched dielectric layer prior to annealing, the further dielectric layer being deposited by a technique other than sputtering.

17. The method of claim 16 wherein the other technique comprises Plasma Enhanced Chemical Vapour Deposition (PECVD).

18. The method of claim 1 in which the capping layer acts as an intermixing cap and further including the step of depositing a further dielectric layer in areas of the device other than the etched and capped layer to act as an intermixing suppressing cap.

19. The method of claim 1 in which the duration of the plasma etch stage is between 0.5 and 20 minutes.

20. The method of claim 1 wherein the thickness of the dielectric layer is around 10 to a few hundred nm.

21. A method of manufacturing an optical device, a device body portion from which the device is to be made including a Quantum Well Intermixing (QWI) structure, the method including the steps of:

providing the device portion;

forming the Quantum Well Intermixing (QWI) structure in the device portion, said step of forming including plasma etching on at least part of a surface of the device body portion by sputtering and subsequently depositing a dielectric layer on said at least part of the surface of the device body portion by sputtering.

* * * * *